(12) United States Patent
James (10) Patent No.: US 6,396,133 B1
(45) Date of Patent: *May 28, 2002

(54) SEMICONDUCTOR DEVICE WITH HEAT-DISSIPATING LEAD-FRAME AND PROCESS OF MANUFACTURING SAME

(75) Inventor: Stephen L. James, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,488

(22) Filed: Sep. 3, 1998

(51) Int. Cl.⁷ ............................................. H01K 23/495
(52) U.S. Cl. ........................ 257/675; 257/707; 257/718
(58) Field of Search ................................. 257/675, 676, 257/796, 707, 706, 712, 722, 718, 719

(56) References Cited

U.S. PATENT DOCUMENTS

| | | | |
|---|---|---|---|
| 3,423,516 A | * | 1/1969 | Sergerson |
| 3,522,490 A | * | 8/1970 | Kauffman |
| 4,235,285 A | * | 11/1980 | Johnson et al. |
| 4,552,206 A | * | 11/1985 | Johnson et al. |
| 4,803,545 A | * | 2/1989 | Birkle |
| 5,146,310 A | * | 9/1992 | Bayan et al. |
| 5,216,283 A | | 6/1993 | Lin ............................ 257/708 |
| 5,305,179 A | * | 4/1994 | Sono et al. |
| 5,311,060 A | | 5/1994 | Rostoker et al. ............ 257/667 |
| 5,381,041 A | * | 1/1995 | Harmon |
| 5,444,304 A | | 8/1995 | Hara et al. .................. 257/722 |
| 5,521,429 A | * | 5/1996 | Aono et al. |
| 5,614,735 A | * | 3/1997 | Kitamura et al. |
| 5,834,842 A | * | 11/1998 | Majumdar et al. |
| 5,995,369 A | * | 11/1999 | Kiermeier et al. |
| 6,104,612 A | * | 8/2000 | Holland |
| 6,262,475 B1 | * | 7/2001 | Liu et al. |

* cited by examiner

Primary Examiner—Sheila V. Clark
(74) Attorney, Agent, or Firm—Hugh R. Kress; Winstead Sechrest & Minick P.C.

(57) ABSTRACT

A semiconductor device assembly is provided. The semiconductor device assembly includes a heat-dissipating lead-frame, a semiconductor chip coupled to the heat-dissipating lead-frame, and an insulating package encapsulating the semiconductor chip and an internal portion of the heat-dissipating lead-frame. The heat-dissipating lead-frame is constructed of a single material. A process is provided for fabricating a semiconductor device assembly. The process includes providing a lead-frame that includes a paddle with external and internal portions, providing a semiconductor chip, thermally coupling the semiconductor chip to the internal portion. The process also includes encapsulating the semiconductor chip and the internal portion in an insulating material.

22 Claims, 9 Drawing Sheets

SEMICONDUCTOR DEVICE WITH HEAT-DISSIPATING LEAD-FRAME AND PROCESS OF MANUFACTURING SAME

BACKGROUND OF THE INVENTION

1. Field of the Invention

This invention relates in general to semiconductor devices and, more particularly, to a semiconductor device assembly having a heat-dissipating lead-frame.

2. Description of the Related Art

As used herein, the term "semiconductor chip" refers to a silicon chip or die containing circuitry to form an active device. The term "semiconductor device assembly" refers to the semiconductor chip, associated components and packaging. The associated components include a lead-frame for mechanically and electrically connecting the device, and internal connections from the chip to the lead-frame. Efforts to provide better semiconductor device assemblies have targeted improving the associated components and packaging.

Figure 1:
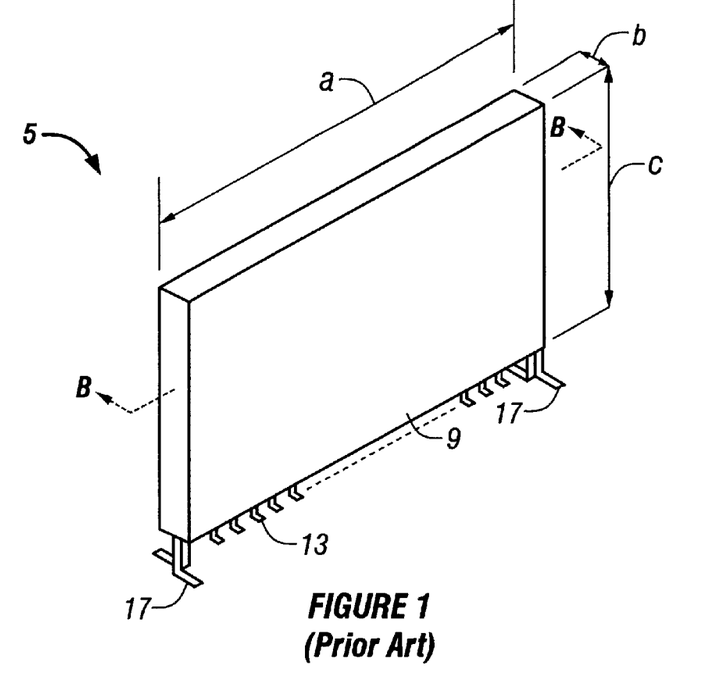
FIG. 1 is a 3-dimensional view of a prior art semiconductor device assembly.
Figure 2A:
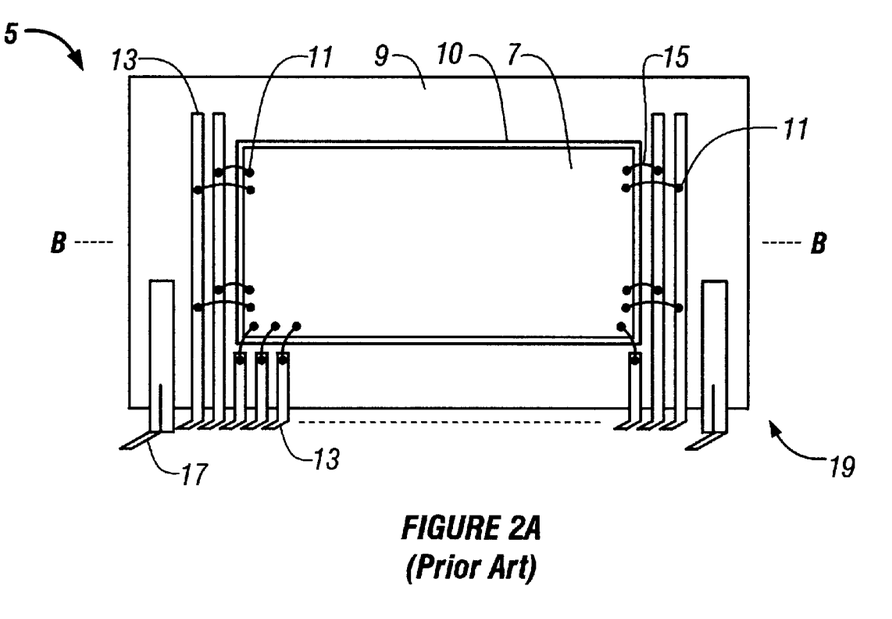
FIG. 2A is a cross-sectional view of the semiconductor device assembly of FIG. 1 taken along line B—B therein.

FIGS. 1 and 2A illustrate a device assembly 5 that uses a plastic package 9 to encapsulate a semiconductor chip 7. FIG. 2A is a cross-sectional view of the semiconductor device assembly 5 along line B—B of FIG. 1. The plastic housing 9 is a rectangular parallelepiped having length a, width b, and height c. The width b is often relatively small compared to a and c. The device assembly 5 also includes a lead-frame 19 comprising a paddle 10, electrical lead terminals 13, and support legs 17. The terminals 13 transmit input and output signals between the chip 7 and a circuit board (not shown). Metallic wires 15 electrically couple electrode contacts 11 on the chip 7 to the lead terminals 13. The support legs 17 provide means for vertically mounting the device assembly 5 on a circuit board.

Figure 2B:
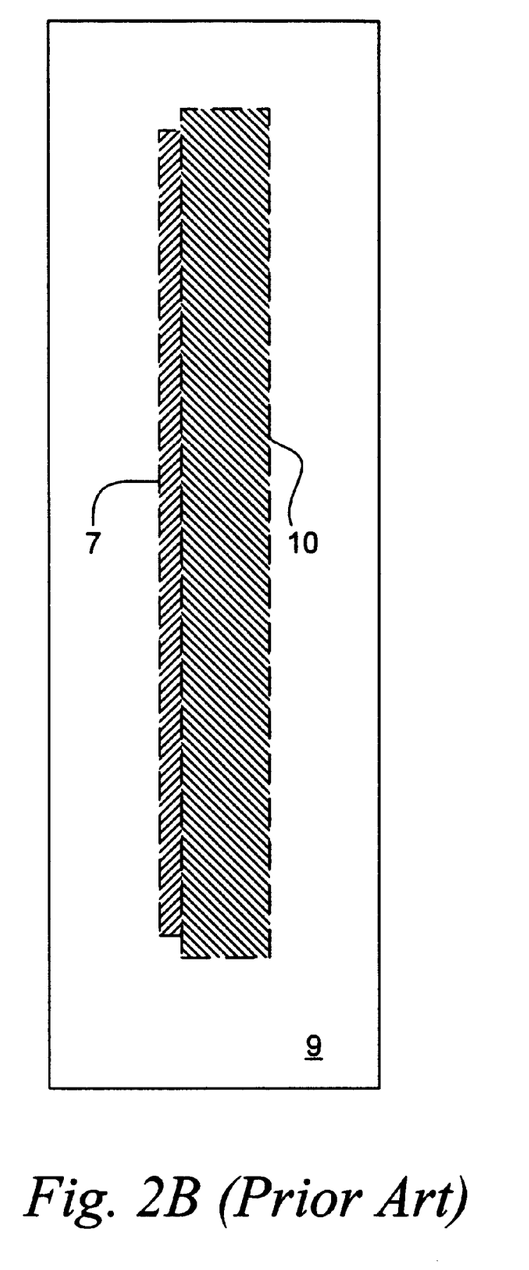
FIG. 2B is a cross-sectional view of the device package of FIG. 2A illustrating the placement of a semiconductor chip and a prior art paddle.

FIG. 2B illustrates the mechanical attachment of the prior art paddle 10 to the semiconductor chip 7. Since the semiconductor chip 7 is a thin and fragile structure, the paddle 10 provides needed mechanical support to protect the semiconductor chip 7 from damage during handling, attachment to the lead terminals 13, and packaging. Typically the paddle 10 is mechanically attached to the semiconductor chip 7 prior to handling and electrical attachment. Since the purpose of the paddle 10 is to give mechanical protection to the semiconductor chip 7, the area of the paddle 10 is generally substantially equal to the area of the semiconductor chip 7. The package 9 encapsulates both the paddle 10 and the semiconductor chip 7 in an insulating material, e.g., plastic.

Referring to FIG. 2A, prior art manufacturing techniques produce the entire lead-frame 19; i.e., the paddle 10, the lead terminals 13, and the support legs 17; from the same material. The lead-frame 19 is often made of a metal alloy or copper and may be produced by stamping or etching the components out of a single piece of metal.

Referring to FIGS. 1 and 2A, the prior art lead-frame 19 provides very limited heat dissipation, because the lead frame 19 is substantially encapsulated within the thermally insulating package 9. Though the electrical terminals 13 and support legs 17 are exposed to the exterior, these components do not have a good thermal contact with the heat producing chip 7 and do not have sufficient external surface area to provide substantial thermal cooling to the chip 7. Thus, the device assembly 5 does not provide the substantial cooling needed for high power chips (not shown).

Heat dissipation must be considered in designing packaging for high power semiconductor chips, because the heat produced may damage the chip if not efficiently dissipated. Plastic packaging substantially impedes heat dissipation due to plastic's insulating properties. High power chips such as static and dynamic random-access memories ("SRAM" and "DRAM," respectfully), transistor-transistor logic ("TTL") and Sync-Link DRAM ("SLDRAM") can produce substantial heat, e.g., up to 2 watts in chips such as SLDRAMs.

Some prior art devices add a heat sink (not shown) to the device assembly 5 of FIGS. 1 and 2A to provide additional cooling for the semiconductor chip 7. The heat sink must be thermally coupled to the semiconductor chip 7 to provide adequate cooling. Thus, an additional fabrication step is needed to couple the heat sink to the chip 7. The additional step can add time and cost to the manufacture of the semiconductor device assembly.

The present invention is directed to overcoming, or at least reducing the effects of, one or more of the problems set forth above.

SUMMARY OF THE INVENTION

In a first aspect of the present invention, a semiconductor device assembly is provided. The semiconductor device assembly includes a heat-dissipating lead-frame, a semiconductor chip coupled to the heat-dissipating lead-frame, and an insulating package encapsulating the semiconductor chip and an internal portion of the heat-dissipating lead-frame. The heat-dissipating lead-frame is constructed of a single material.

In a second aspect of the present invention, a process is provided for fabricating a semiconductor device assembly. The process includes providing a lead-frame that includes a paddle with external and internal portions, providing a semiconductor chip, thermally coupling the semiconductor chip to the internal portion. The process also includes encapsulating the semiconductor chip and the internal portion in an insulating material.

BRIEF DESCRIPTION OF THE DRAWINGS

Other aspects and advantages of the invention will become apparent upon reading the following detailed description and upon reference to the drawings, in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Specific embodiments of the invention are described below. In the interest of clarity, not all features of an actual implementation are described in this specification. It will of course be appreciated that in the development of any such actual embodiment, numerous implementation-specific decisions must be made to achieve the developers' specific goals, which will vary from one implementation to another. Moreover, it will be appreciated that such a development effort, even if complex and time-consuming, would be a routine undertaking for those of ordinary skill in the art having the benefit of this disclosure.

Henceforth, the term heat-dissipating lead-frame refers to a lead-frame having both lead terminals and a paddle, wherein the paddle has portions both internal and external to the encapsulating package of the device assembly using the lead-frame.

Figure 3:
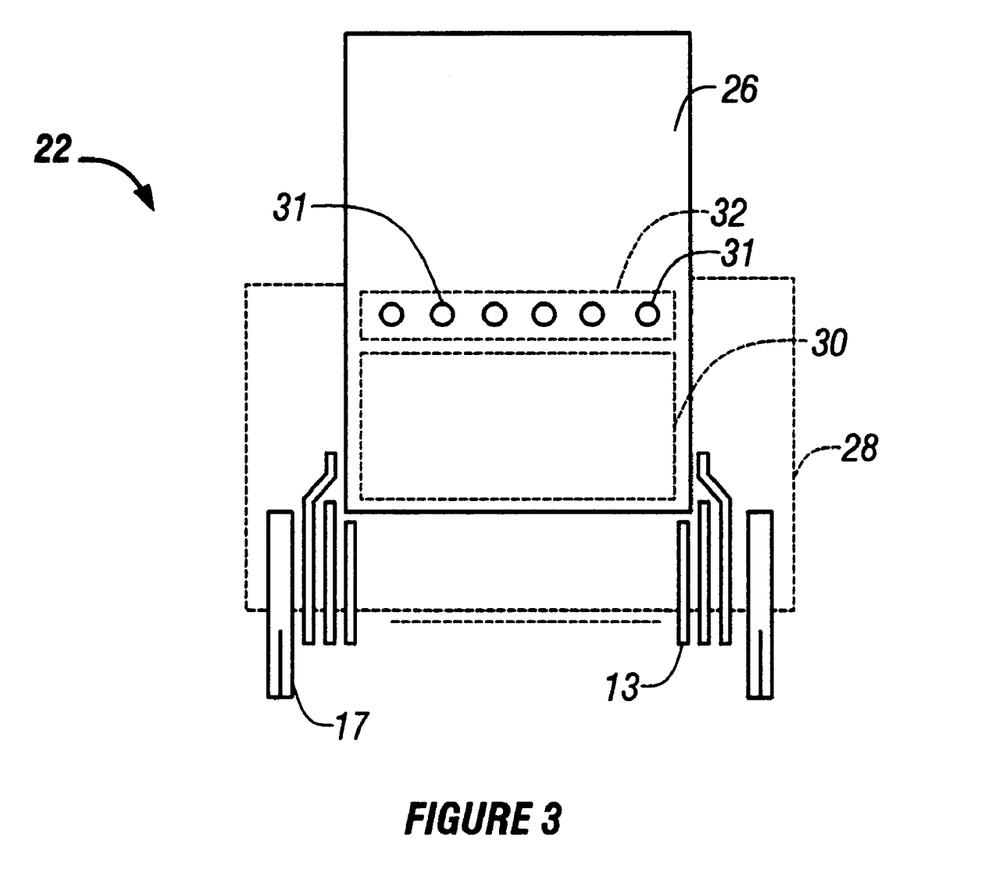
FIG. 3 illustrates one embodiment of a heat-dissipating lead-frame.

FIG. 3 illustrates one embodiment of a heat-dissipating lead-frame 22 in accordance with the present invention. The heat-dissipating lead-frame 22 has electrical lead terminals 13, support legs 17, and a paddle 26. A region 30 of the paddle 26 will mechanically and thermally couple to a semiconductor chip (not shown). The paddle 26 extends to the exterior of a region 28, which will be encapsulated within the insulating package of the assembled semiconductor device assembly (both not shown). The paddle 26 has integrity holes 31 in an area 32 so that encapsulating material of the final insulating package 28 will cure therethrough fixing the paddle 26 more rigidly. However, the use of the integrity holes 31 is not necessary to the practice of the invention and may be omitted in some embodiments. This is particularly true where the encapsulating material has enough adhesive strength to bond without the integrity holes 31.

Still referring to FIG. 3, conventional etching or stamping techniques produce the entire heat-dissipating lead-frame 22, i.e., the paddle 26, the lead terminals 13, and the support legs 17, from a single piece of metal. The heat-dissipating lead-frame 22 is made of a metal such as copper or of a metal alloy. Since the lead-frame 22 dissipates heat produced by the semiconductor chip, the use of the heat-dissipating lead-frame 22 eliminates the need for a heat sink. Since the production and attachment of a heat sink can be costly, semiconductor device assembly packages the heat-dissipating lead-frame 22 can be less expensive to produce than prior art assemblies that use heat sinks. The heat-dissipating lead-frame 22 may also provide increased structural integrity to the device assembly by providing for better encapsulation than is available for device assemblies having external heat sinks.

Figure 4:
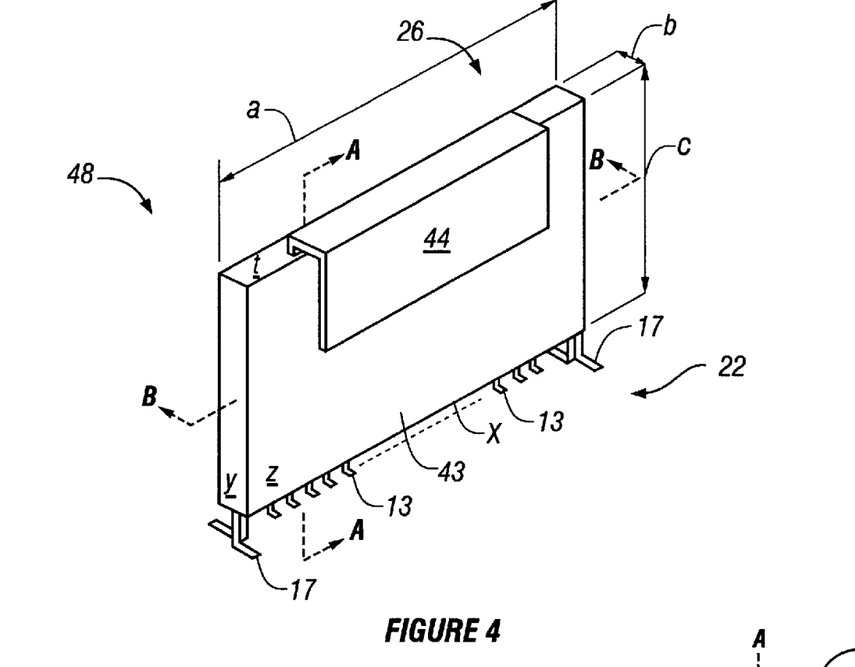
FIG. 4 is a 3-dimensional view of a semiconductor device assembly employing the heat-dissipating lead-frame of FIG. 3.

FIG. 4 is a 3-dimensional view of a semiconductor device assembly 48, i.e., a vertical surface mount package, in accordance with one embodiment of the present invention. The insulating package 43 has the form of a rectangular parallelepiped with front/back face surfaces z of length "a" and height "c," top/bottom surfaces t, x of length "a" and width "b" and end surfaces y of height "c" and width "b." An external portion 44 of the paddle 26 penetrates through the smaller area, top surface t. The paddle 26 does not penetrate through the larger area, front and back surfaces z. The external portion 44 of paddle 26 may be modified to a shape that depends on the particular implementation.

Still referring to FIG. 4, bending or crimping have shaped the external portion 44 of the paddle 26 of FIG. 3 to define a spatial gap 46 between the insulating package 43 and the external portion 44. In one embodiment, an adhesive material (not shown) such as a thermal gel or a epoxy material fills the gap 46 securing the external portion 44 to the exterior of the large area, front surface z of the package 43. After modifying the external portion 44, the resultant device assembly 48 can be mounted on a connector board (not shown), e.g., by soldering the lead terminals 13 and the support lengths 17 to the board.

Figure 5A:
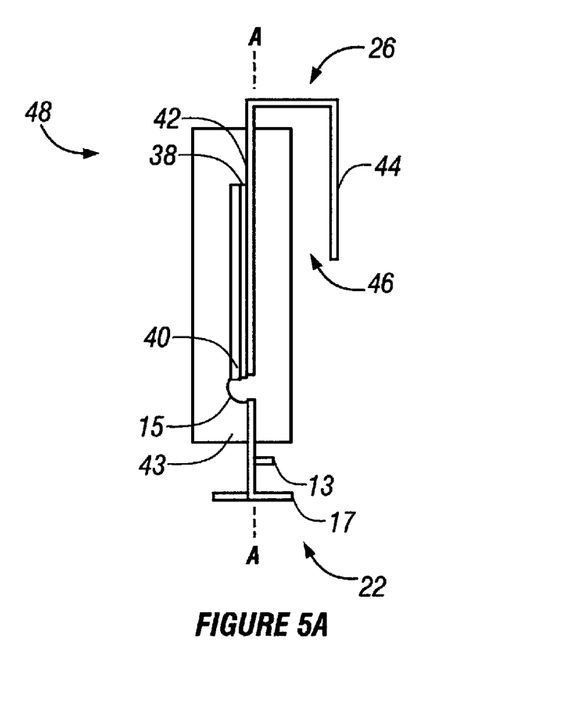
FIGS. 5A and 5B are cross-sectional views of the device assembly of FIG. 4 taken along respective lines A—A and line B—B therein.
Figure 5B:
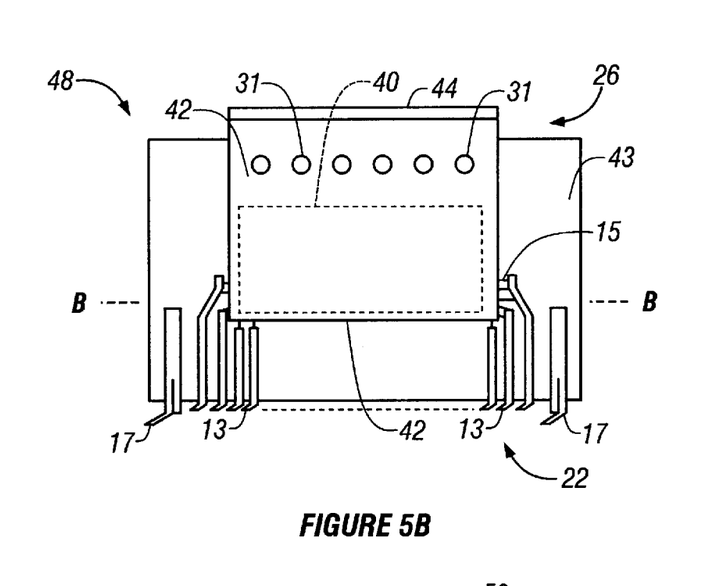

FIGS. 5A and 5B are cross-sectional views of the semiconductor device assembly 48 of FIGS. 3 and 4. In some embodiments, lead-on-chip (LOC) tape 38 mechanically and thermally attaches the semiconductor chip 40 to the internal portion 42 of the paddle 26. Metallic wires 15 electrically connect the semiconductor chip 40 to the lead terminals 13.

Still referring to FIGS. 5A and 5B, the insulating package 43 encapsulates the semiconductor chip 40, the internal portion 42 of the paddle 26, internal portions of the lead terminals 13, and internal portions of the support legs 17. The two sides of the package 43 connect through the integrity holes 31 in the paddle 26. The package 43 may be formed by injecting liquid plastic resin into a molding die. The package 43 may be a conventional plastic mold material such as a filled epoxy, a poly-resin, or silicon polymer or another electrically and thermally insulating material.

In some embodiments, the outer surfaces the semiconductor device assembly 48 have a round or curved form (not shown). In such embodiments, the external portions 44 of the paddle 26 of FIG. 4 protrude through the small area surfaces of the package to increase the strength and integrity of the encapsulating package.

Figure 5C:
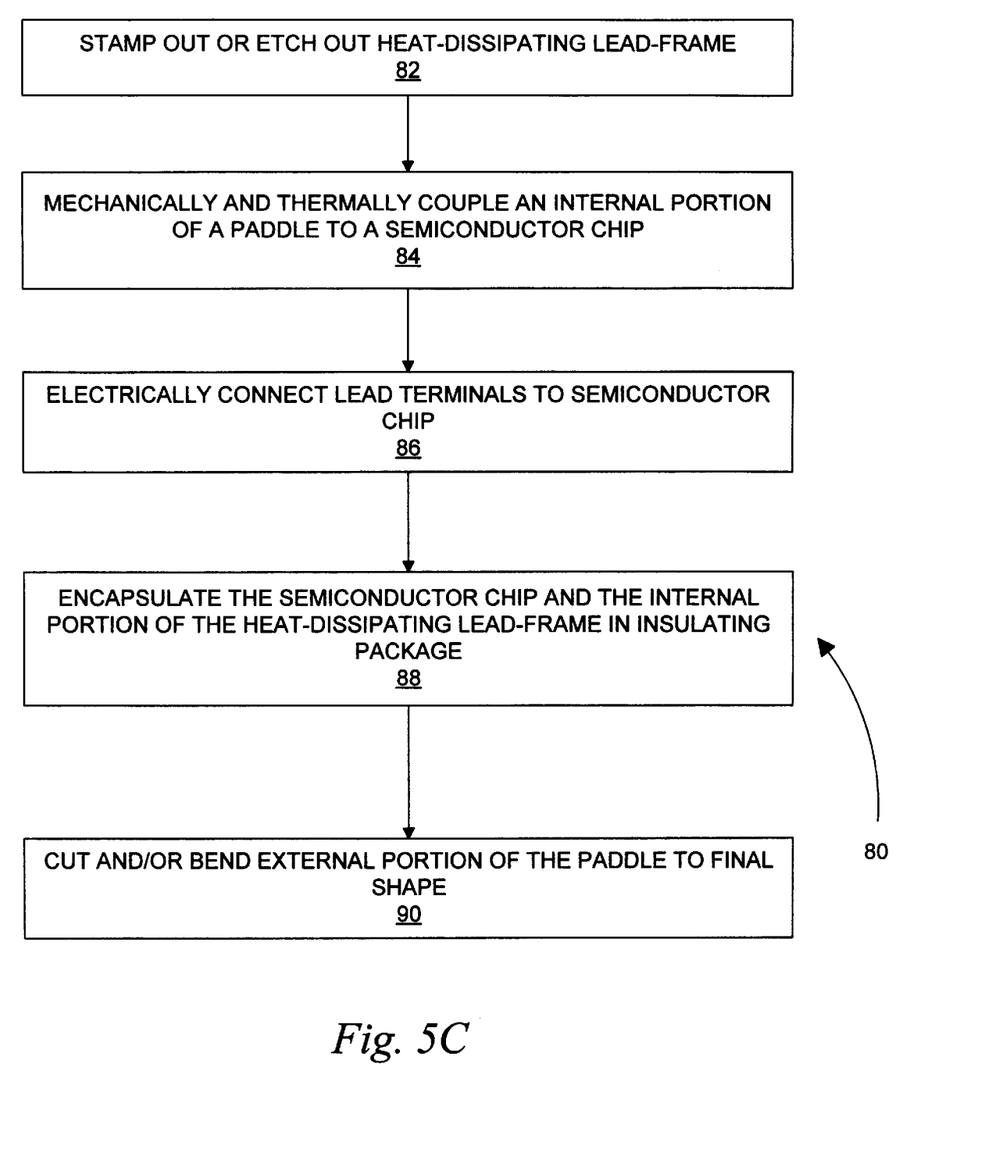
FIG. 5C is a flowchart illustrating one embodiment of a method of fabrication for the semiconductor device assembly of FIGS. 3, 4, 5A, and 5B.

FIG. 5C is a flowchart illustrating a method 80 of fabrication for the semiconductor device assembly 48 of FIGS. 4, 5A, and 5B. At block 82, the heat-dissipating lead frame 22 is stamped or etched out of a piece of metal. At block 84, the semiconductor chip 40 is mechanically and thermally coupled to an internal portion 42 of the paddle 26. The semiconductor chip 40 may be a SRAM, DRAM, TTL and SLDRAM although the invention is not limited to such chips. At block 86, the lead terminals 13 are electrically connected to the semiconductor chip 40 by the wires 15. At block 88, the semiconductor chip 40 and internal portion of the heat-dissipating lead-frame 22 are encapsulated in the insulating package 43. At block 90, the external portion 44 of the paddle 26 is bent and/or cut to take a desired final shape.

In one embodiment, a lead-on-chip (LOC) tape 38 couples the paddle 26 to the semiconductor chip 40. To form the coupling, the LOC tape 38 is positioned, on the internal portion 42 of the paddle 26. Then, the semiconductor chip 40 is positioned on the LOC tape 38 and pressure and a heated environment are used to compress the LOC tape 38 between the semiconductor chip 40 and the internal portion 42. The heated environment and pressure makes the LOC tape 38 pliable forming a seal between the internal portion 42 of the paddle 26 and the semiconductor chip 40. In some embodiments, the LOC tape 38 has a final thickness of about $10^{-7}$ inches.

The LOC tape 38 provides a direct heat transfer path from the semiconductor chip 40 to the paddle 26. But, the LOC tape 38 does not couple the semiconductor chip 40 and the paddle 26 electrically. The LOC tape 38 can have thermal conduction properties similar to those of conductive epoxies such as SILOXANE® produced by 3M® or to those of silicon gels.

Figure 6A:
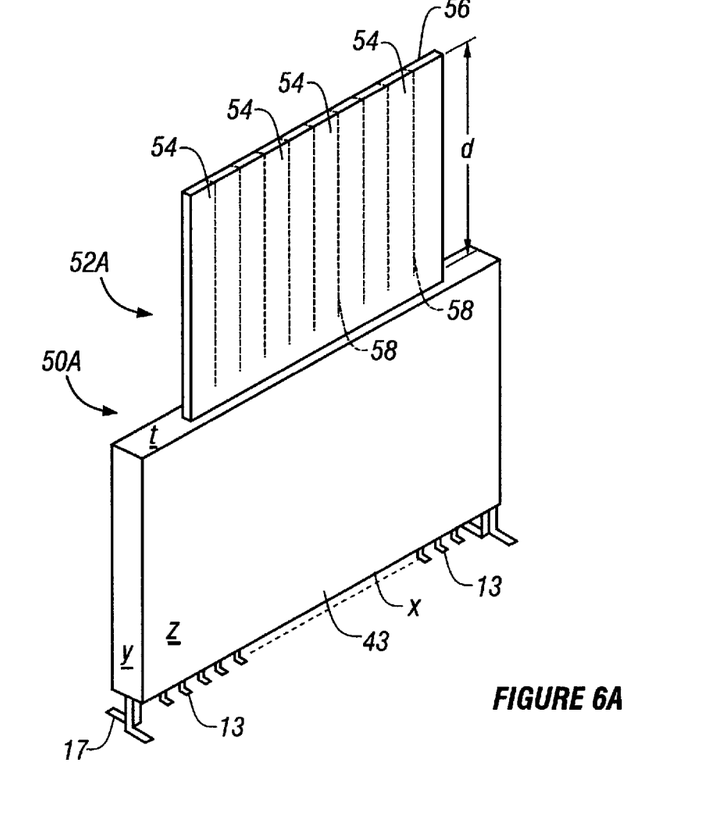
FIGS. 6A, 6B, and 6C are 3-dimensional views of alternate embodiments for the external portion of the paddle of FIG. 3.
Figure 6B:
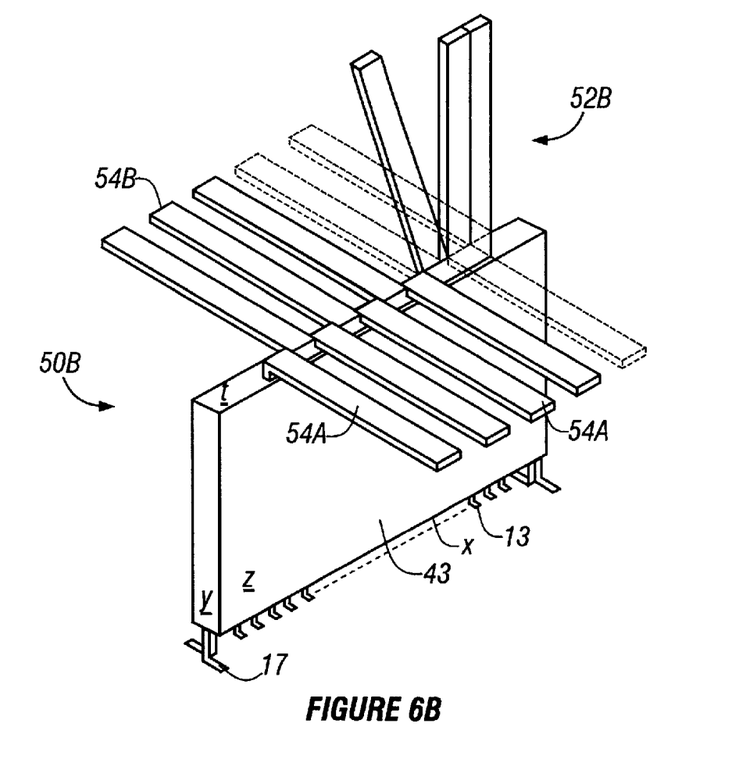
Figure 6C:
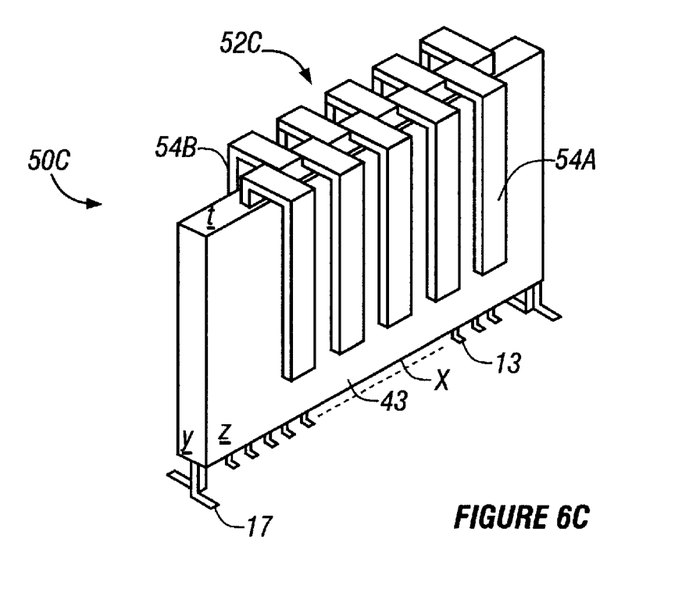

FIGS. 6A, 6B, and 6C, illustrate VSMP assemblies 50A, 50B, 50C having alternate external fin-type structures 52A, 52B, 52C for the paddle 26. The VSMP assemblies 50A, 50B, 50C can be fabricated with the method described in FIG. 5C.

FIG. 6A illustrates an exterior fin structure 52A having a plurality of strips or divided fins 54. To form the exterior fin structure 52A, fins 54 may be sawed or sheared using scissors or lasers. The distal ends 56 of the fins 54 extend a distance d from a point 58 adjacent the package 43. The point 58 may define a bending or crimping a point as shown in FIG. 6B.

Referring to FIG. 6B, the fins 54 of FIG. 6A have been bent or crimped to form an interlacing pattern for which the final fins 54A and 54B alternately extending out from front and back face surfaces z, respectively. This interlacing structure 52B can be used to increase the packing density so that a first VSMP assembly 50B may be positioned on a connection board (not shown) adjacent to a second VSMP assembly (not shown). The interlacing fins 54A of the first VSMP assembly 50B are adapted to fit between interlacing fins 54B of the second VSMP assembly 50B.

The VSMP assembly 50B of FIG. 6B can be further shaped to form the alternate embodiment 50C illustrated in FIG. 6C. In this embodiment, interlacing fins 54A and 54B wrap around respective front and back face surfaces z of a VSMP assembly 50C. By wrapping the fins 54A and 54B around both surfaces z, less space may be needed for mounting each VSMP assembly 50C on a connection board (not shown). Additionally, the resultant VSMP assembly 50C provides a cage structure 52C to protect the assembly 50C from external mechanical damage. In some embodiments, the interlacing fins 54A and 54B contact a grounding pad on the connector board (not shown).

Figure 7:
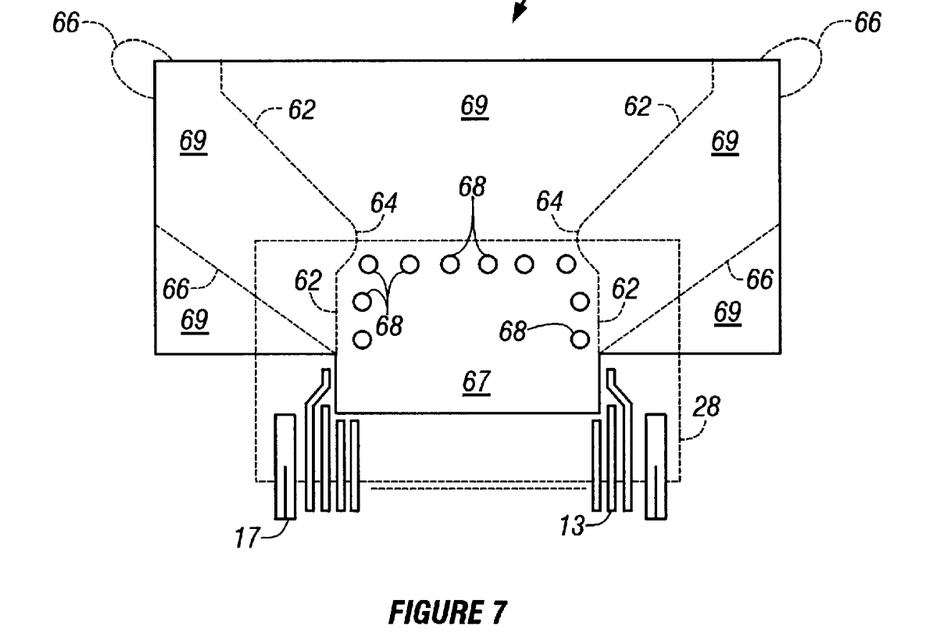
FIG. 7 illustrates an alternate embodiment of a heat-dissipating lead-frame.

FIG. 7 illustrates an alternate starting shape for a paddle 60 having internal and external portions 67, 69. In some embodiments, the paddle 60 may be cut along lines 62, 64 to shape to paddle 60. The cutting also removes portions of the paddle 60 from the region 28 of the final encapsulating package (not shown) so that a greater portion of the encapsulating material bonds to itself thereby securing the paddle 60 more firmly. In some embodiments part of the external portion 69 is cut from the starting shape 60 to produce the final shape 66. The final paddle 66 still provides a large external to internal area ratio, which substantially increases heat dissipation.

Still referring to FIG. 7, some embodiments have integrity holes 68 in the internal portion 67 of the paddle 60. The integrity holes can increase the rigidity of the bond between the final insulating package (not shown) and the paddle 60. A stronger bond may reduce the risk of damage to the semiconductor chip (not shown) due to relative movement of the paddle. The integrity holes 68 may also increase the overall strength and integrity of the package.

Figure 8:
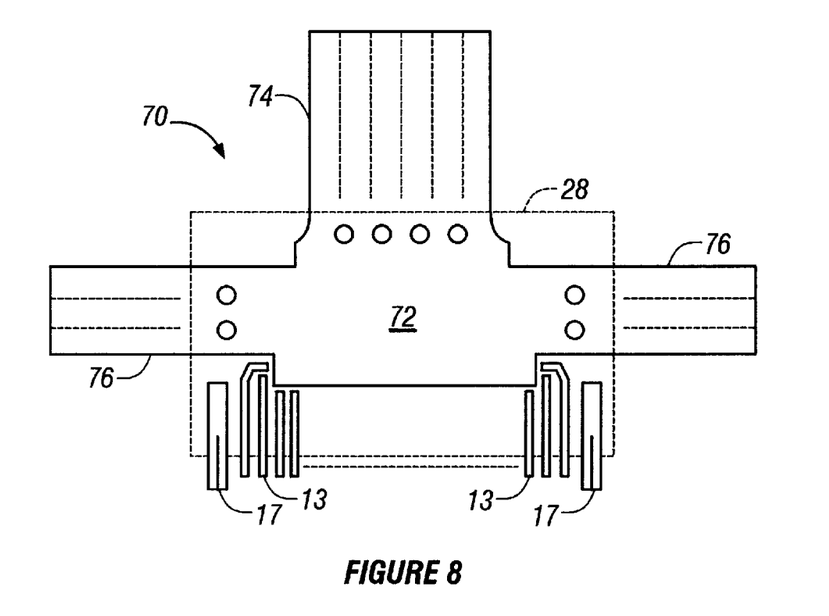
FIG. 8 illustrates another alternate embodiment of a heat-dissipating lead-frame.
Figure 9:
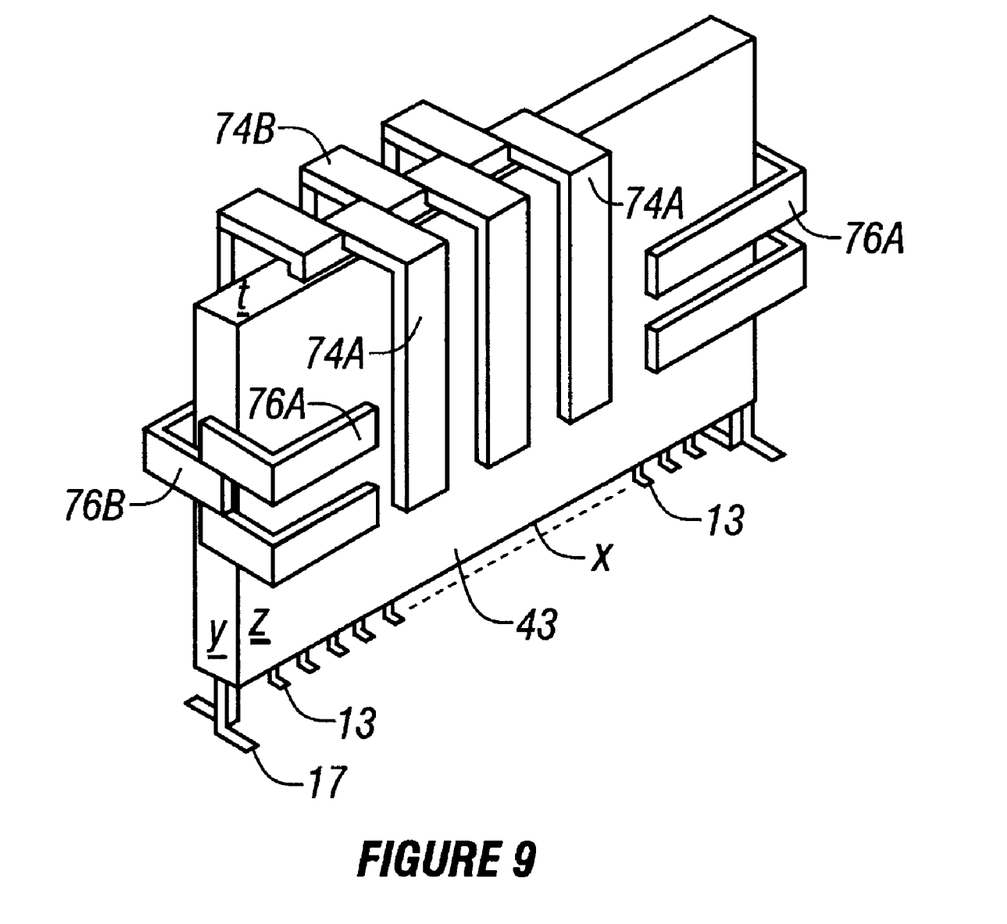
FIG. 9 is a 3-dimensional view of a semiconductor device assembly using the heat dissipating lead-frame of FIG. 8.

FIGS. 8 and 9 illustrate an alternate embodiment of a heat-dissipating lead-frame 70 with a paddle 72. The paddle 72 has a top fin portion 74 and two side fin portions 76. Each fin portion 74, 76 extends past the encapsulating region 28 and can wrap around front or back face surfaces z as illustrated in FIG. 9. The fin portions 74, 67 protrude from smaller area surfaces t, y as opposed to the large area surfaces z so that the package 43 has greater structural integrity. The resulting structure has interlacing fins 74A, 74B and interlacing fins 76A, 76B perpendicular thereto.

Referring to FIGS. 3, 4, and 5A–5B, the semiconductor chip 40 converts a portion of the electrical power used into heat. The heat passes from the chip 40 through the conductive LOC tape 38 and into the internal portion 42 of the paddle 26. The internal portion 42 transfers the heat to the external portion 44. The external portion 44 dissipates the heat into the surrounding environment, e.g., the air. External cooling means (not shown), e.g., air convection or forced air cooling, may assist with the dissipation of the heat from the external portion 44. In some embodiments, semiconductor chip 40 producing about 1.0 watts of heat or more and can still maintain a temperature of between about 70 to 120 degrees C by the above-described heat transfer.

Referring again to FIGS. 3, 4, 5A, and 5B, the paddle 26 is integrated into the lead-frame 22 and dissipates heat. Thus, additional assembly needed to install heat sinks can be eliminated. Furthermore, the above-described embodiments can provide a more durable device assembly than many prior art device assembles employing heat sinks, because the encapsulating package 43 surrounds a substantial portion of the two broad surfaces of the paddle 26. The paddles 26, 60, 72 of the embodiments of FIGS. 3–9 penetrate the top and side surfaces t, y having smaller areas and do not penetrate through the front and back surfaces z having larger areas. This should be contrasted with prior art devices in which the plastic housing did not surround two broad surfaces of the heat sink. In such prior art devices, the heat sink could easily break off or move thereby damaging the semiconductor chip 6 or reducing the quality of the thermal contact between semiconductor chip 6 and the paddles 26, 60, 70.

Illustrative embodiments of the invention are described above. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints. Though such a development effort might be complex and time-consuming, it would nevertheless be a routine undertaking for those of ordinary skill in the art having the benefit of this disclosure.

What is claimed is:

1. A semiconductor device assembly, comprising:
   a heat-dissipating lead-frame having surface portions;
   an insulating package having a surface, said package encapsulating the semiconductor chip and an internal portion of said heat-dissipating lead-frame; and
   wherein said surface of said insulating package comprises two opposing larger area exterior side faces and a plurality of exterior end faces each having areas relatively smaller than said larger area exterior faces, and wherein said heat-dissipating lead-frame surface portions are substantially parallel to and adjacent both of said two opposing larger area exterior side faces.

2. The device assembly of claim 1, wherein the heat-dissipating lead-frame comprises a paddle and lead terminals, the lead terminals being electrically connected to the semiconductor chip and the paddle being mechanically connected to the semiconductor chip.

3. The device assembly of claim 2, wherein said paddle protrudes from one of said smaller area exterior end faces.

4. The device assembly of claim 2, wherein said paddle defines a plurality of fins.

5. The assembly of claim 4, further including an adhesive material positioned between said adjacent one of said larger area exterior side faces and said portion of said external portion of the paddle.

6. The assembly of claim 1, wherein said package is a single piece of molded plastic.

7. The assembly of claim 1, wherein the semiconductor chip is capable of using at least 1 watt of power.

8. A semiconductor device assembly, comprising:
   a paddle;
   a plurality of lead terminals, said paddle and said lead terminals being constructed of a common material;
   a semiconductor chip being electrically connected to said lead terminals and mechanically affixed to said paddle;
   an insulating package defining opposing first and second larger area exterior side faces and a plurality of exterior edge faces each having areas relatively smaller than said opposing first and second larger area exterior side faces and encapsulating said semiconductor chip, the paddle having internal portions being located internal and external to said insulating package; and
   an adhesive located between said semiconductor chip and an adjacent portion of said internal portion of the paddle, said adhesive being thermally conducting and electrically insulating;
   wherein said external portion of said paddle is configured to be adjacent and substantially parallel to both of said opposing first and second larger area exterior side faces.

9. The device assembly of claim 8, wherein the paddle is adapted to dissipate heat from the semiconductor chip to the exterior of the package at both of said opposing first and second larger area exterior side faces.

10. The device assembly of claim 9, wherein said external portion of the paddle has a fin configuration.

11. The device assembly of claim 10, wherein said fin configuration comprises first and second fins directed in first and second opposite directions.

12. The device assembly of claim 10, wherein first and second fins protrude from said insulating package adjacent opposite sides of said opposing first and second larger area faces.

13. The device assembly of claim 10, wherein said fin configuration comprises a plurality of fins, adjacent ones of said fins being directed in substantially opposite directions.

14. The assembly of claim 10, wherein said fin configuration comprises a plurality of fins extending substantially parallel to and adjacent both of said opposing first and second larger area exterior side faces.

15. The assembly of claim 8, wherein said internal portion of the paddle has a plurality of integrity holes, material of the package passing through the integrity holes.

16. A vertical surface mount package (VSMP) assembly comprising:
   a semiconductor chip;
   a heat-dissipating lead-frame having lead terminals and a paddle, said lead-frame having a surface portion;
   said semiconductor chip and portion of said paddle being thermally and mechanically coupled;
   an insulating housing encapsulating an internal portion of the paddle, an external portion of said paddle protruding from said housing;
   wherein said housing defines opposing first and second larger area exterior side faces and a plurality of exterior end faces with areas relatively smaller than said opposing first and second larger area exterior side faces; and
   wherein the external portion of said paddle is adjacent to both of said opposing first and second larger area exterior side faces.

17. The VSMP assembly of claim 16, wherein a portion of said paddle protrudes through one of said plurality of the exterior end faces.

18. The VSMP assembly of claim 17, wherein the lead terminals electrically couple to said semiconductor chip and extend from a second exterior end face of said VSMP assembly.

19. The VSMP assembly of claim 17, the paddle and the lead terminals being made of a common material.

20. The assembly of claim 8, wherein said adhesive forms a seal between the semiconductor chip and the adjacent portion of the internal portion of the paddle.

21. The assembly of claim 14, wherein said adhesive has a thickness of about $10^{-7}$ inches.

22. The assembly of claim 14, wherein the plurality of fins wraps around the front and back surfaces of the insulating package.

* * * * *

UNITED STATES PATENT AND TRADEMARK OFFICE
CERTIFICATE OF CORRECTION

PATENT NO.    : 6,396,133 B1
DATED         : May 28, 2002
INVENTOR(S)   : Stephen L. James

It is certified that error appears in the above-identified patent and that said Letters Patent is hereby corrected as shown below:

Column 7,
Lines 45-48, should be corrected to read as follows:

12. The device assembly of claim 10, wherein first and second fins protrude from said insulating package adjacent opposite sides of said opposing first and second larger area exterior side faces.

Signed and Sealed this

Second Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,396,133 B1
DATED         : May 28, 2002
INVENTOR(S)   : Stephen L. James It is certified that error appears in the above-identified patent and that said Letters Patent is hereby corrected as shown below:

Column 6,
Lines 54-65, should be corrected to read as follows:

1. A semiconductor device assembly, comprising:
    a heat-dissipating lead-frame having surface portions;
    a semiconductor chip being coupled to said heat-dissipating lead-frame; and
        an insulating package having a surface, said package encapsulating the semiconductor chip and an internal portion of said heat-dissipating lead-frame; and
    wherein said surface of said insulating package comprises two opposing larger area exterior side faces and a plurality of exterior end faces each having areas relatively smaller than said larger area exterior faces, and wherein said heat-dissipating lead-frame surface portions are substantially parallel to and adjacent both of said two opposing larger area exterior side faces.

Column 7,
Lines 15-35, should be corrected to read as follows:
8. A semiconductor device assembly, comprising:
    a paddle;
    a plurality of lead terminals, said paddle and said lead terminals being constructed of a common material;
    a semiconductor chip being electrically connected to said lead terminals and mechanically affixed to said paddle;
    an insulating package defining opposing first and second larger area exterior side faces and a plurality of exterior edge faces each having areas relatively smaller than said opposing first and second larger area exterior side faces and encapsulating said semiconductor chip, the paddle having internal and external portions being located internal and external to said insulating package; and

UNITED STATES PATENT AND TRADEMARK OFFICE
CERTIFICATE OF CORRECTION

PATENT NO. : 6,396,133 B1
DATED : May 28, 2002
INVENTOR(S) : Stephen L. James

It is certified that error appears in the above-identified patent and that said Letters Patent is hereby corrected as shown below:

Column 7 cont'd,
    an adhesive located between said semiconductor chip and an adjacent portion of said internal portion of the paddle, said adhesive being thermally conducting and electrically insulating;
  wherein said external portion of said paddle is configured to be adjacent and substantially parallel to both of said opposing first and second larger area exterior side faces.

Signed and Sealed this

Eighteenth Day of November, 2003

JAMES E. ROGAN
*Director of the United States Patent and Trademark Office*